(12) United States Patent
Okabe et al.

(10) Patent No.: US 7,360,985 B2
(45) Date of Patent: Apr. 22, 2008

(54) WAFER PROCESSING APPARATUS INCLUDING CLEAN BOX STOPPING MECHANISM

(75) Inventors: Tsutomu Okabe, Tokyo (JP); Hiroshi Igarashi, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 75 days.

(21) Appl. No.: 10/330,098

(22) Filed: Dec. 30, 2002

(65) Prior Publication Data

US 2004/0127029 A1    Jul. 1, 2004

(51) Int. Cl.
  *B65G 1/00* (2006.01)
  *E04H 6/00* (2006.01)
  *H01L 21/677* (2006.01)
  *A01H 5/08* (2006.01)

(52) U.S. Cl. .................. 414/808; 414/288; 414/217; 414/652

(58) Field of Classification Search ............ 414/217, 414/217.1, 900, 652, 435, 411, 416.03, 416.08, 414/937, 940, 939, 801, 808; 438/689; 141/98, 65
See application file for complete search history.

(56) References Cited

U.S. PATENT DOCUMENTS

| | | | |
|---|---|---|---|
| 5,139,459 A | | 8/1992 | Takahashi et al. |
| 5,772,386 A | | 6/1998 | Mages et al. |
| 5,980,195 A | * | 11/1999 | Miyashita .................. 414/783 |
| 6,071,059 A | | 6/2000 | Mages et al. |
| 6,082,948 A | | 7/2000 | Fishkin et al. |
| 6,082,951 A | * | 7/2000 | Nering et al. ............ 414/217.1 |
| 6,186,723 B1 | * | 2/2001 | Murata et al. .............. 414/217 |
| 6,318,860 B1 | | 11/2001 | Suzumura |
| 6,352,403 B1 | | 3/2002 | Fishkin et al. |
| 6,375,403 B1 | | 4/2002 | Mages et al. |
| 6,393,334 B1 | * | 5/2002 | Lewis et al. .................. 700/117 |
| 6,398,475 B1 | * | 6/2002 | Ishikawa .................... 414/217 |
| 6,530,736 B2 | * | 3/2003 | Rosenquist ................. 414/411 |
| 6,592,318 B2 | * | 7/2003 | Aggarwal ................ 414/217.1 |
| 6,641,349 B1 | * | 11/2003 | Miyajima et al. ........... 414/217 |
| 2004/0013498 A1 | * | 1/2004 | Soucy et al. ................ 414/217 |
| 2004/0013500 A1 | * | 1/2004 | Gilchrist .................... 414/217 |
| 2004/0035493 A1 | * | 2/2004 | Miyajima et al. ............. 141/98 |

FOREIGN PATENT DOCUMENTS

| | | |
|---|---|---|
| JP | 63-028047 | 2/1988 |
| JP | 05-003240 | 1/1993 |
| JP | 2525284 | 5/1996 |

(Continued)

*Primary Examiner*—Saul Rodriguez
*Assistant Examiner*—Gregory W Adams
(74) *Attorney, Agent, or Firm*—Oblon, Spivak, McClelland, Maier & Neustadt, P.C.

(57) ABSTRACT

The semiconductor wafer processing apparatus includes a clean box having an opening, a lid for closing the opening, a door to be in contact with the lid and to detach the lid from the clean box, a first stopper adapted to move in conjunction with movement of the clean box without a change in its relative positional relationship with the clean box, and an unmoved second stopper. With this structure, it is possible to prevent the clean box moved on the semiconductor wafer processing apparatus from colliding with the apparatus, even if the clean box manufactured by molding using a reinforced plastic in accordance with a prescribed standard includes a manufacturing error in its size.

2 Claims, 4 Drawing Sheets

FOREIGN PATENT DOCUMENTS

| | | |
|---|---|---|
| JP | 2722306 | 11/1997 |
| JP | 2757102 | 3/1998 |
| JP | 2850279 | 11/1998 |
| JP | 2864458 | 12/1998 |
| JP | 11-145244 | 5/1999 |
| JP | 2000-262472 | 9/2000 |
| JP | 3184479 | 4/2001 |
| JP | 2002-076093 | 3/2002 |
| JP | 2002151373 A * | 5/2002 |
| JP | 2002151563 A * | 5/2002 |
| JP | 2004140378 A * | 5/2004 |

* cited by examiner

WAFER PROCESSING APPARATUS INCLUDING CLEAN BOX STOPPING MECHANISM

BACKGROUND OF THE INVENTION

1. Field of the Invention

The present invention relates to a semiconductor wafer processing apparatus having a cushion function, which is used in manufacturing processes for semiconductor devices, electronic parts and related products, or optical disks etc. The semiconductor wafer processing apparatus receives a semiconductor wafer (which will be simply referred to as a wafer hereinafter) from a clean box that stores the wafer and performs processing of the wafer with a collision avoidance function.

2. Description of Related Art

Manufacturing of wafers, which are used for semiconductor devices etc., must be performed under a condition in which a high degree of cleanness is ensured. Therefore, manufacturing of wafers was generally performed in a clean room the whole interior of which is kept in a highly clean condition. However construction and maintenance of a large clean room with a high degree of cleanness require a significant initial investment and service costs. In addition, even if once a plant investment is made for such a clean room, a modification of the layout of the room might be required later due to a modification in the manufacturing process, which would require a large additional investment. Therefore, use of clean rooms is uneconomical. In view of the above-described situation, recently a certain method has been widely adopted, that is, to keep a high degree of cleanness not within the whole interior space of a room but only within a small environmental space (which will be referred to as a mini-environment) inside a processing apparatus to attain the effects same as those obtained by keeping a high degree of cleanness within the whole of the room. (In the following, a processing apparatus that adopts this method will be called a semiconductor wafer processing apparatus.)

Specifically, semiconductor wafer processing apparatus as shown in FIG. 1 are arranged in a manufacturing room. When the door 3 of the semiconductor wafer processing apparatus 10 is in a closed state, a mini-environment portion 5 in which processing of a wafer is performed is kept in a highly clean condition. Wafers 7 are transferred from one semiconductor wafer processing apparatus to another using a wafer storing container hermetically closed by a lid 4, whereby the interior of the container is kept in a highly clean condition. This wafer storing container is composed of a box body in the form of a housing and the lid 4. This container will be referred to as a clean box 6 hereinafter. The wafers 7 having been delivered to a semiconductor wafer processing apparatus by the clean box 6 is subjected to further transportation in the interior of the semiconductor wafer processing apparatus. The mini-environment portion 5 is provided with a window opening 2 that functions as an access opening through which wafers 7 are to be transferred into the mini-environment portion 5. The opening 2 is closed by the door 3 that is provided in the interior of the mini-environment portion 5. The door 3 is provided with a holding means for holding the lid 4, such as suction means or a latch mechanism etc.

The clean box 6 having been delivered to the semiconductor wafer processing apparatus is placed on a docking plate 12 with the lid 4 of the box facing toward the window opening 2 of the mini-environment portion 5. Then the docking plate 12 is moved (in the right direction in FIG. 1) so that the clean box 6 is brought to a position (which will be referred to as a prescribed position hereinafter) close to the window opening 2 provided on the semiconductor wafer processing apparatus 10 and stopped. After the clean box 6 is stopped at the prescribed position, the lid 4 is held by the door 3 and brought into the interior of the mini-environment portion 5 with the door 3. Thus, the lid 4 is detached from the clean box 6 and the window opening 2 is made open. The wafers 7 stored in the clean box 6 are transferred into the semiconductor wafer processing apparatus 10 through the window opening 2 that has been made open. Thus, the space to which the wafers are exposed can be always kept highly clean without a need for establishing a highly clean condition within the whole interior of the manufacturing room. Therefore, this method realizes the effects same as those attained by establishing a clean room condition within the whole of the room, and so it is possible to reduce construction and maintenance costs to realize an effective manufacturing process.

In this semiconductor wafer processing apparatus 10, the clean box 6 is generally manufactured in accordance with a standard. In other words, the shape, size and weight of the clean box 6 are standardized, so that the clean box 6 can be used in a plurality of semiconductor processing apparatus 10 without changing the specification of the clean box 6.

On the other hand, Japanese Patent Application No. 2000-262472 discloses a semiconductor wafer processing apparatus having a dust proof function. In the wafer processing apparatus disclosed in that application, a clean box is not in contact with the wall of a mini-environment portion, and small clearance is formed between the mini-environment portion and the clean box.

The clean box is generally manufactured by molding using a reinforced plastic in accordance with the above-mentioned standard. In that standard, a reference length that is designated by numeral 11 in FIG. 1 with respect to the opening side end of the clean box is determined in reference to the center of the clean box.

However, even if the clean box is molded in accordance with the standard, size range by a manufacturing errors in molding. In addition, there are minor differences between manufacturers in their interpretations of the standard length 11 that is defined as the length between the center of the clean box 6 and the opening side end of the clean box 6. Those differences includes, for example, whether the width of the flange portion is to be included in the reference length or not. Therefore, there are variations in the size of actually manufactured clean boxes 6, which cause various problems as follows.

In the following, the problems will be described with reference to FIGS. 4A to 4C.

FIGS. 4A to 4C are schematic drawing showing a portion of the equipment shown in FIG. 1, in which a portion including the clean box 6 is illustrated in an enlarged manner. In these drawings, the exaggeration is made in order to specifically illustrate the above-mentioned problems.

For example, FIG. 4A shows a case in which the reference length 11 of the manufactured clean box 6 is too short. In this case, when the docking plate 12 is stopped at a prescribed position, the lid 4 is not in contact with the door 3. In the case shown in FIG. 4A, there is a problem that a holding means 8 does not operate normally and the door 3 cannot hold the lid 4 appropriately, since the lid 4 and the door 3 cannot be in contact with each other.

FIG. 4B shows a case that is contrary to the case show in FIG. 4A, namely FIG. 4B shows a case in which the reference length 11 is too long. In this case, the surface, of the clean box 6 would collide with the wall of the semiconductor processing apparatus 10 before the docking plate 12 reaches the prescribed position. The collision might result in damaging of the clean box 6 or damaging of the semiconductor wafer processing apparatus, 10, or trouble of the docking plate 12, which is a problem.

FIG. 4C shows a case in which the lid 4 is too thick. In this case, the lid 4 abuts the door 3 before the movement of the docking plate 12 is completed. Since conventional driving devices for moving the docking plate 12 use a motor, the driving of the docking plate 12 continue after that. However, if the motor continues to drive the docking plate 12 in spite that the movement of the clean box 6 is blocked by the door 3, an excessive load that can damage the motor is exerted on the motor, which is a problem.

SUMMARY OF THE INVENTION

In view of the above-mentioned problems, an object of the present invention is to provide a wafer processing apparatus that can prevent collision of a clean box when the clean box is moved to a position at which the lid is to be opened/closed, even if there are variations in the size of the clean boxes.

According to the present invention, there is provided a semiconductor wafer processing apparatus configured to receive a wafer from a clean box including a box body that has an opening portion at one side thereof and a lid for closing the opening portion, comprising, a main housing having a window opening at one side thereof, an openable/closable door for closing the window opening, a movable member, on which the clean box is to be placed, provided below the window opening, adapted to be horizontally movable toward and away from the main housing, and adapted to move, after the clean box is placed thereon, toward the main housing so as to bring the clean box to a prescribed position at which a wafer is taken out from the clean box, and a stopper for stopping, when the movable member moves toward the main housing, the movable member at a predetermined position, wherein when the movable member on which the clean box is placed is moved toward the main housing, the lid of the clean box is brought into contact with the door before the movable member is stopped by the stopper, after the lid is brought into contact with the door, the door is moved together with the clean box toward the interior of the main housing while holding the lid, until the movable member is stopped by the stopper, and the door is further moved, after the movable member is stopped by the stopper, while holding the lid so as to detach the lid from the box body to open the clean box.

Other objects and aspects of the invention will become apparent from the following description of embodiments with reference to the accompanying drawings.

DETAILED DESCRIPTION OF THE PREFERRED EMBODIMENT

Figure 1:
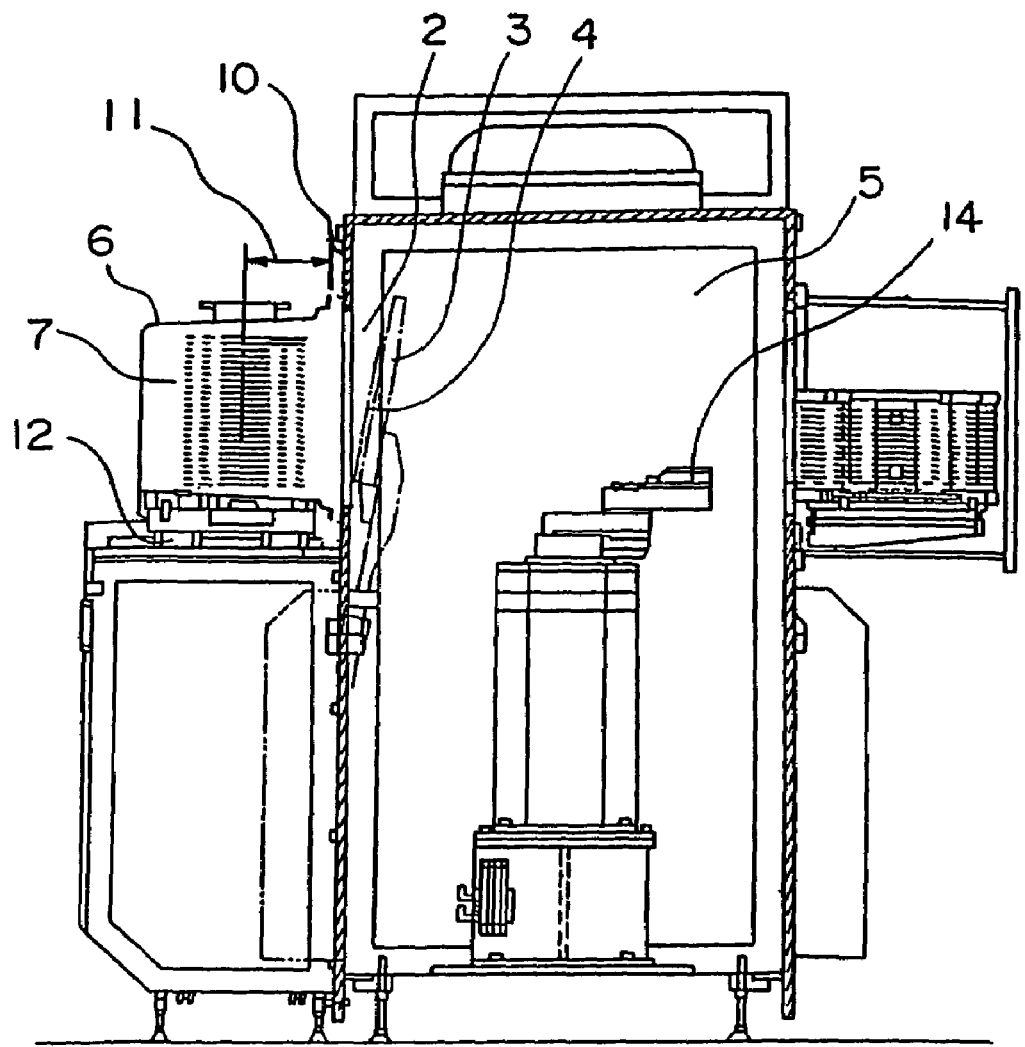
FIG. 1 is an overall view showing a semiconductor wafer processing apparatus to which the present invention is applied.

In the following, an embodiment of the invention will be described with reference to the drawings. FIG. 1 is a drawing showing the overall structure of a semiconductor wafer processing apparatus 10. The semiconductor wafer processing apparatus 10 includes a mini-environment portion 5, in which a robot arm 14 is provided. The interior of the mini-environment portion 5 is pressurized to a pressure that is higher than the ambient pressure (that is generally, the atmospheric pressure) outside the semiconductor wafer processing apparatus 10.

The mini-environment portion 5 has a window opening 2 through which the robot arm 14 receives wafers 7. In the interior of the mini-environment portion 5, there is provided a door 3 for closing the window opening 2. The door 3 is composed of a body portion 25 for closing the opening and a support portion 26. The support portion 26 is supported on a driving portion. The driving portion is adapted to be moved up and down by, for example, an air cylinder (not shown) and adapted to cause the support portion 26 to swing about a pivot disposed in the driving portion.

A clean box 6 is used for transferring wafers 7 from one semiconductor processing apparatus 10 to another. The wafers 7 are accommodated in the clean box 6, and the clean box is closed by a lid 4 in a highly airtight manner. Thus, when the wafers 7 are accommodated in the clean box 6, the interior of the clean box 6 is ensured to be in a highly clean condition. The interior of the clean box 6 may be filled with a gas such as nitrogen of high purity.

Figure 2:
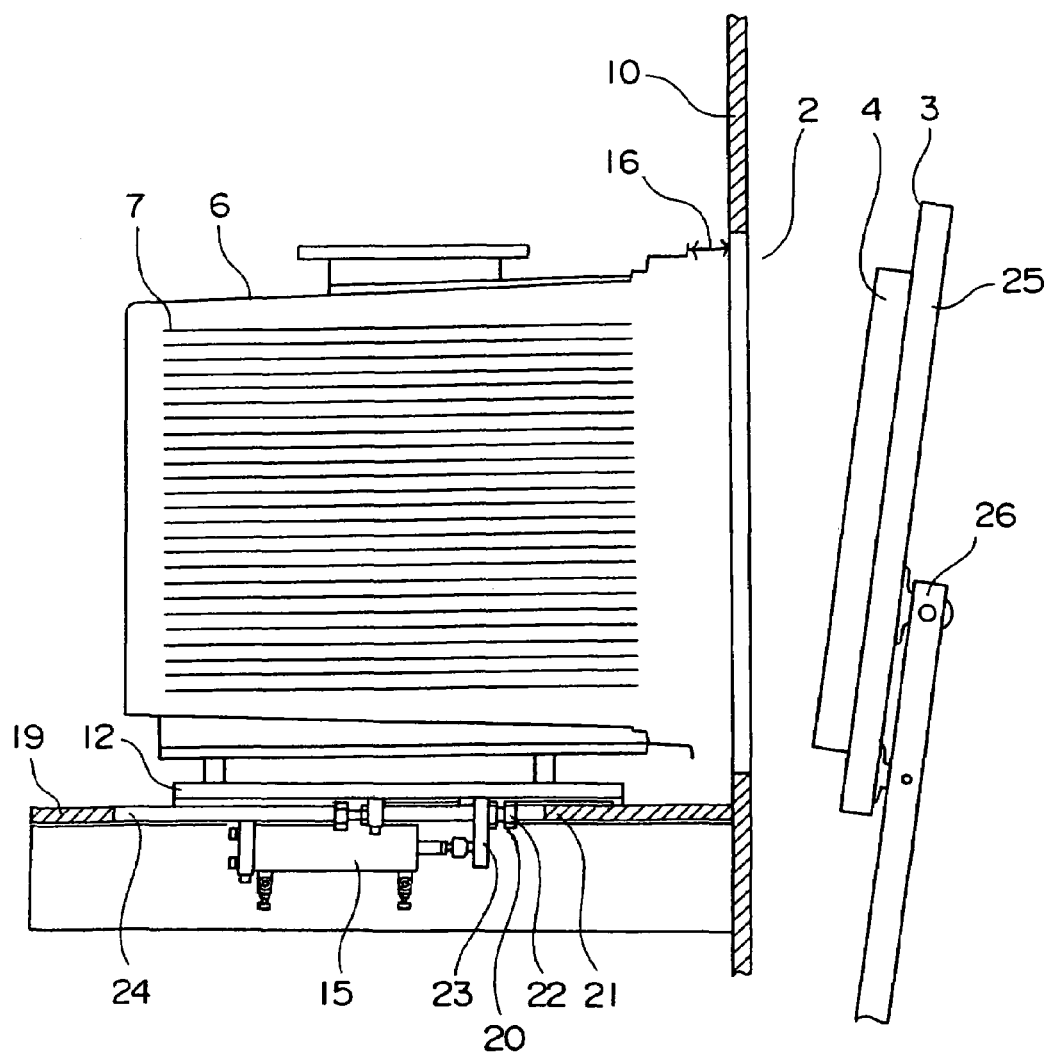
FIG. 2 is an enlarged view showing a portion including a clean box, of the semiconductor wafer processing apparatus show in FIG. 1.

The semiconductor processing apparatus 10 is provided with a docking plate 12 on which the clean box is to be placed. FIG. 2 is an enlarged view of a portion including the clean box 6 of FIG. 1. The docking plate 12 is mounted on a rail and provided with an air cylinder 15. The air cylinder 15 can drive the clean box 6 together with the docking plate 12 toward the mini-environment portion 5 (i.e. in the right direction in FIG. 2) and away from the mini-environment portion 5 (i.e. in the left direction in FIG. 2). When the clean box 6 is moved close to the mini-environment portion 5, the vertical position (in the vertical direction of the window opening 2) and the horizontal position (in the horizontal direction of the window opening 2) of the clean box 6 are arranged in such a way that the lid 4 is fitted within the area of the window opening 2 and aligned with it. Thus, when the wafers 7 are to be transferred from the clean box 6 to the semiconductor wafer processing apparatus 10, the docking plate 12 is moved,toward the mini-environment portion 5 (this operation will be referred to as "a docking operation" hereinafter) On the other hand, when processing of the wafers 7 has been completed and the clean box 6 is to be detached from the semiconductor wafer processing apparatus 10 and transferred to the next semiconductor wafer processing apparatus, the docking plate 12 is moved away from the mini-environment portion 5.

The docking plate 12 is disposed on an access table 19 that is provided on the semiconductor wafer processing apparatus 10. The access table 19 has a bore 24 having a substantially rectangular shape. The bore 24 is provided in order to prevent the air cylinder and other parts provided on the docking plate 12 for moving the docking plate 12 from interfering with the access table 19.

The docking plate 12, which is a movable part, is provided with a first stopper 20, while the semiconductor wafer processing apparatus 10 is provided with a second stopper 21. The first stopper 20 is provided with an abutting member 22 that is to be in surface contact with the second stopper 21. The abutting member 22 is attached to a supporting member 23 that is extending from the bottom surface of the docking plate 12 downward through the bore 24. On the other hand, the second stopper 21 is constituted by an inner side surface of the access plate 19 that defines the edge of the bore 24. The abutting member 22 is so provided as to be opposed to the inner edge of the access plate 19 defining the bore 24, so that when the docking plate 12 is moved toward the window opening 2 (i.e. in the right direction in FIG. 2), the abutting member 22 would abut that edge defining the bore 24.

The second stopper 21 may be constructed as a separate member composed of members similar to the abutting member 22 and the supporting member 23 of the first stopper instead of as the edge defining the bore 24. In that case, the effects same as the structure of this embodiment can be realized by arranging the first stopper 20 and the second stopper 21 in such a way that the abutting surfaces of them are adjusted to be in the same height and opposed to each other to allow abutment.

Figure 3A:
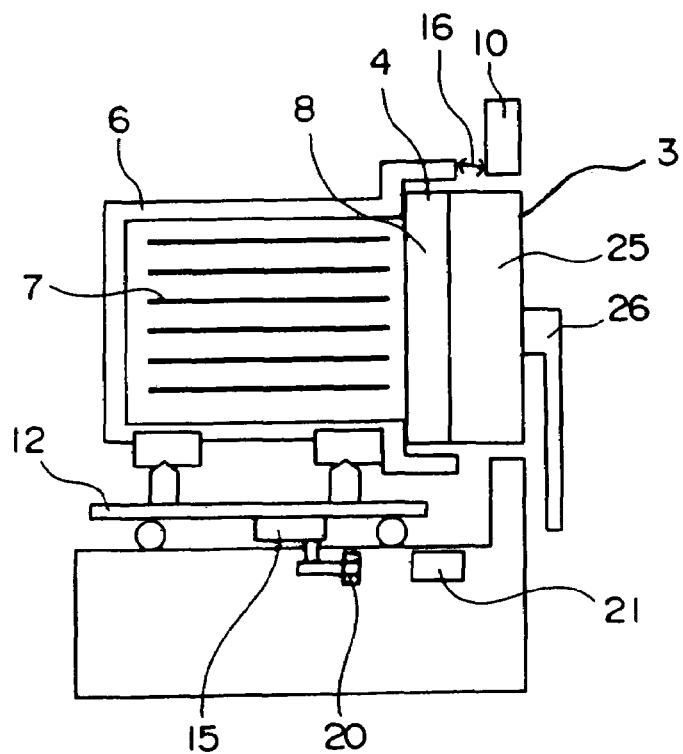
FIGS. 3A and 3B are drawings schematically illustrating the principle of the present invention.
Figure 3B:
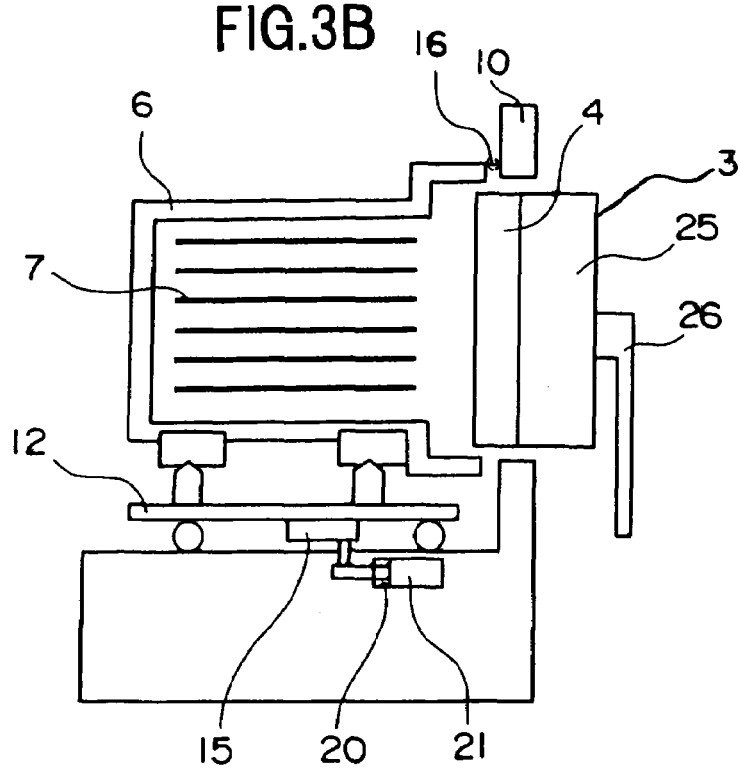
Figure 4A:
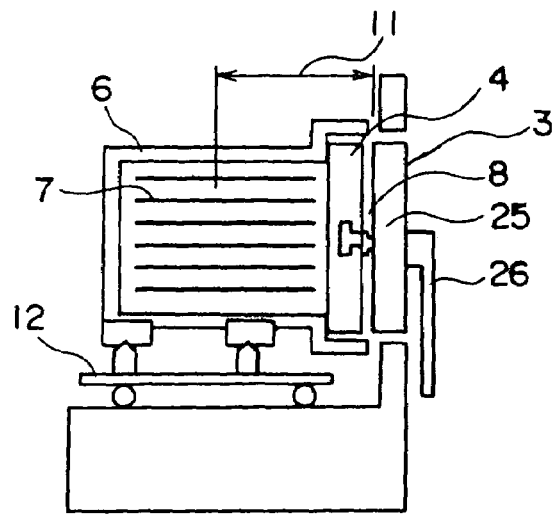
FIGS. 4A, 4B and 4C are drawings showing prior arts.
Figure 4B:
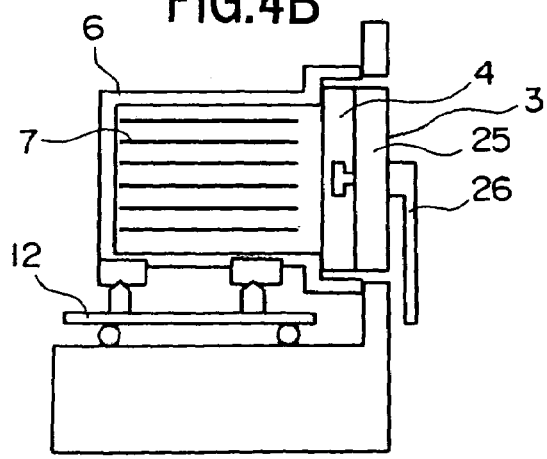
Figure 4C:
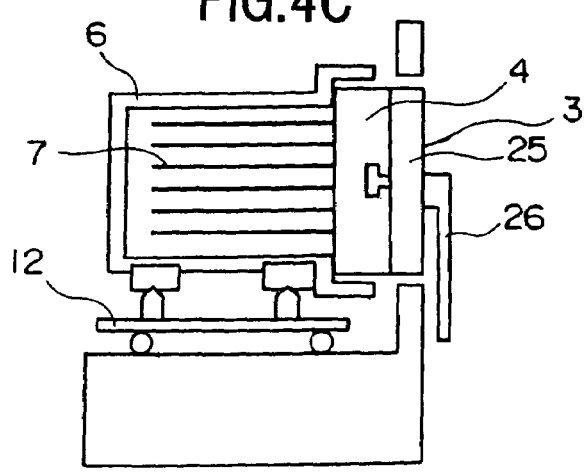

Next, a description will be made of operations of the above-described structure with reference to FIGS. 3A and 3B. FIGS. 3A and 3B are drawings schematically showing the movement of the docking plate 12 on the occasion of the docking operation. In FIGS. 3A and 3B, each constituent part is also illustrated in a schematic manner.

When the transferring of wafers 7 is not performed, the window opening 2 is closed by the door 3 provided in the interior of the mini-environment portion 5. The clean box 6 is closed by the lid 4 in a sealed state.

After the preceding process has been completed, the clean box 6 is fixed to a predetermined position on the docking plate 12. After the clean box 6 is fixed to the docking plate 12, the docking operation of the docking plate 12 is started (not shown). After the docking operation has been started and the docking plate 12 has been moved in a prescribed manner, the lid 4 of the clean box 6 abuts the door 3, as shown in FIG. 3A. In this state, the first stopper 20 and the second stopper 21 are not in contact with each other. At this stage, the docking plate 12 cannot move forward, since a part of the clean box 6, that is, the lid 4 is blocked by the door 3. Then, the lid 4 is held by the door 3 with a holding mechanism 8. Under this state, the docking plate 12 is biased or pressed toward the window opening 2 by the air cylinder 15.

After the abutment of the lid 4 and the door 3 is confirmed, the support portion 26 of the door 3 is swung about a pivot disposed in the driving portion, and the door 3 is moved away from the wall of the semiconductor wafer processing apparatus 10 toward the inner side of the apparatus (i.e. into the interior of the mini-environment portion 5). Then the clean box 6 starts to move together with the docking plate 12, so that the docking operation is restarted. During this process, the lid 4 is not detached from the clean box 6, though the door swings with the support portion 26, since the clean box 6 itself moves in tandem with the door 3.

With further swinging of the door 3 and docking operation, the first stopper 20 and the second stopper 21 are eventually in contact with each other, and the docking plate 12 is stopped. Since the docking plate 12 cannot move anymore, the clean box 6 cannot move anymore too. Therefore, when the door 3 continues swinging further, the lid 4 is moved with the door 3 that holds the lid 4 and detached from the clean box 6 as shown in FIG. 3B, since the clean box 6 is fixed.

After completion of the detachment of the lid 4 from the clean box 6, the door 3 is moved downward while holding the lid 4. Thus, the interior of the mini-environment portion 5 and the interior of the clean box 6 are made accessible from each other through the window opening 2. Under this state, a wafer 7 accommodated in the clean box 6 is transferred to the interior of the mini-environment portion 5 through the window opening 2.

On the other hand, when the window opening 2 is to be closed by the door for allowing processing of the wafer 7, the door 3 is moved following the process reverse to the above-described process, that is, the door 3 is moved upward, and the support portion 26 is swung about the pivot disposed in the driving portion, so that the window opening 2 is closed by the body portion 25 and the lid 4 is housed in the body housing of the clean box 6 to close it in a sealing manner.

In the case of the semiconductor wafer processing apparatus having a dust proof function as disclosed in Japanese Patent Application No. 2000-262472, clearance 16 of about 2 mm should be formed between the clean box 6 and the semiconductor wafer processing apparatus 10, as shown in FIG. 3A. On the other hand, tolerance in the size of the clean box 6 is about ±0.5 mm to 1 mm. Therefore, it is required that the clean box 6 be stopped accurately with the clearance of 2 mm being secured while the tolerance in the size is taken into account. This can be attained by arranging the positions of the first stopper 20 and the second stopper 21 in advance in such a way that when the first stopper 20 and the second stopper 21 are in contact with each other, clearance of at least 2 mm is formed between the clean box 6 and the semiconductor wafer processing apparatus 10. With such arrangement, even if there are variations in the size of clean boxes 6 as described before, the clean box can be stopped at a prescribed position. Therefore, the clean box will not collide with the semiconductor wafer processing apparatus while ensuring the relationship of a distance sufficient for opening/closing of the lid 4.

The present invention realizes the following advantageous effects.

(1) If there are variations in the size of clean boxes or the thickness of lids due to manufacturing tolerance etc., the clean box can be prevented from colliding with the semiconductor wafer processing apparatus, and it is possible to ensure the relationship of a distance sufficient for opening/closing of the lid 4.

(2) It is possible to adjust the position at which the clean box should be stopped only by adjusting the contact positions of the first and second stoppers.

It is to be understood that the form of my invention herein shown and described is to be taken as a preferred example of the same and that various changes inn the shape, size and arrangement of parts may be resorted without departing from the spirit of my invention or the scope of the subjoined claims.

What is claimed is:

1. A method for transferring a wafer between a clean box including a box body that has an opening portion at one side thereof and a lid, the method comprising:

provinding a wafer process apparatus including:
a main housing having a window opening at one side thereof;
a movable member, on which said clean box is to be placed, provided below the window opening, adapted to be horizontally movable toward and away from said main housing;

an air cylinder configured to horizontally move said movable member toward and away from said main housing;

an openable/closable door movable into or from an interior of said main housing for closing the window opening; and a stopper configured to stop the movement of said movable member toward said main housing, said method further comprising the steps of:

placing said clean box on said movable member;

moving said movable member with the clean box toward said main housing, by said air cylinder;

stopping the movement of said movable member at once by contacting a surface of the lid of said clean box with a surface of said openable/closable door, with a bias force generated by said air cylinder through the movable member, and holding the lid by said openable/closable door;

moving said movable member toward the interior of said main housing while keeping the lid in tandem with said box body and said door; and stopping said movable member by abutting said movable member to said stopper so as to position said box body at a prescribed position but continuously moving the lid toward the interior of said main housing by said openable/closable door, so that the lid is separated from the box body so as to make a wafer transferable between said main housing and the box body, wherein a predetermined clearance is made between a plane on which the opening of the box body opens and a plane on which the window opening opens, when the box body is positioned at the prescribed position, and the predetermined clearance has such a distance that a collision between the plane on which the opening of the box body opens and the plane on which the window opening opens is prevented, irrespective of manufacturing tolerance in the size of the box body and the thickness of the lid.

2. A method according to claim 1, wherein said prescribed position is adjustable in order to control the position at which the box body is stopped.

* * * * *